(12) United States Patent
Xiao et al.

(10) Patent No.: US 12,471,209 B2
(45) Date of Patent: Nov. 11, 2025

(54) CIRCUIT BOARD AND ELECTRONIC DEVICE THEREOF

(71) Applicants: Wuhan Tianma Microelectronics Co., Ltd., Wuhan (CN); Wuhan Tianma Microelectronics Co., Ltd. Shanghai Branch, Shanghai (CN)

(72) Inventors: Xuejing Xiao, Wuhan (CN); Zhenzhen Xie, Wuhan (CN)

(73) Assignees: Wuhan Tianma Microelectronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 175 days.

(21) Appl. No.: 18/422,117

(22) Filed: Jan. 25, 2024

(65) Prior Publication Data
US 2024/0206050 A1 Jun. 20, 2024

(30) Foreign Application Priority Data
Feb. 27, 2023 (CN) .......................... 202310177009.9

(51) Int. Cl.
*H05K 1/02* (2006.01)
*H05K 1/18* (2006.01)
*H05K 3/28* (2006.01)
*H05K 5/02* (2006.01)

(52) U.S. Cl.
CPC ............. *H05K 1/0269* (2013.01); *H05K 5/02* (2013.01); *H05K 1/181* (2013.01); *H05K 2201/0104* (2013.01); *H05K 2201/0175* (2013.01); *H05K 2201/0209* (2013.01); *H05K 2201/10015* (2013.01); *H05K 2201/10022* (2013.01); *H05K 2201/10159* (2013.01)

(58) Field of Classification Search
CPC ...... H05K 1/0269; H05K 1/181; H05K 1/185; H05K 3/284
See application file for complete search history.

(56) References Cited

U.S. PATENT DOCUMENTS

| | | | |
|---|---|---|---|
| 2015/0185142 A1* | 7/2015 | Zeng | H10K 59/874 250/340 |
| 2018/0007793 A1* | 1/2018 | Zhang | H05K 1/189 |
| 2018/0190938 A1* | 7/2018 | Wang | H10K 59/874 |
| 2022/0199951 A1* | 6/2022 | Ryu | H10K 59/873 |

FOREIGN PATENT DOCUMENTS

| | | |
|---|---|---|
| CN | 102072904 A | 5/2011 |
| CN | 111995905 A | 11/2020 |
| CN | 113437200 A | 9/2021 |

* cited by examiner

*Primary Examiner* — Timothy J Thompson
*Assistant Examiner* — Amol H Patel
(74) *Attorney, Agent, or Firm* — KDW FIRM PLLC

(57) ABSTRACT

Provided is a circuit board and an electronic device thereof. The circuit board includes: a substrate; an insulating ink layer disposed on the substrate; a component disposed on a side of the insulating ink layer facing away from the substrate, where the component is electrically connected to the substrate through a window opening area on the substrate; and an encapsulation layer disposed on a side of the component facing away from the substrate. The insulating ink layer includes a first hydrochromic material, and in a case where humidity exceeds a first humidity threshold, the first hydrochromic material changes from a first color to a second color.

20 Claims, 8 Drawing Sheets

CIRCUIT BOARD AND ELECTRONIC DEVICE THEREOF

CROSS-REFERENCE TO RELATED APPLICATION

This application claims priority to Chinese Patent Application No. 202310177009.9 filed Feb. 27, 2023, the disclosure of which is incorporated herein by reference in its entirety.

TECHNICAL FIELD

The present disclosure relates to the field of display technology and, in particular, to a circuit board and an electronic device thereof.

BACKGROUND

Currently, a printed circuit board product needs to undergo testing items such as waterproofing, artificial sweat, and salt spray before use. In the related art, the product needs to be placed in the preceding testing environments and then powered on. Based on various performances of the product after power-on, whether moisture enters the product can be determined. The preceding determination process is cumbersome, requires a lot of manpower and materials, has a relatively high cost, and cannot achieve quick determination.

SUMMARY

Embodiments of the present disclosure provide a circuit board and an electronic device thereof so as to test waterproof performance in a fast, simple, and low-cost manner.

In a first aspect, an embodiment of the present disclosure provides a circuit board, including a substrate, an insulating ink layer, a component, and an encapsulation layer.

The insulating ink layer is disposed on the substrate.

The component is disposed on a side of the insulating ink layer facing away from the substrate, where the component is electrically connected to the substrate through a window opening area on the substrate.

The encapsulation layer is disposed on a side of the component facing away from the substrate.

The insulating ink layer includes a first hydrochromic material, in a case where humidity exceeds a first humidity threshold, the first hydrochromic material changes from a first color to a second color.

In a second aspect, an embodiment of the present disclosure provides an electronic device, including the circuit board described in the first aspect.

The electronic device also includes a display panel and a device housing, where a side of the device housing attached to the display panel is an inner side of the device housing, the inner side of the device housing is provided with a fourth hydrochromic material, and in a case where humidity exceeds a fourth humidity threshold, the fourth hydrochromic material changes from a seventh color to an eighth color.

DETAILED DESCRIPTION

Figure 1:
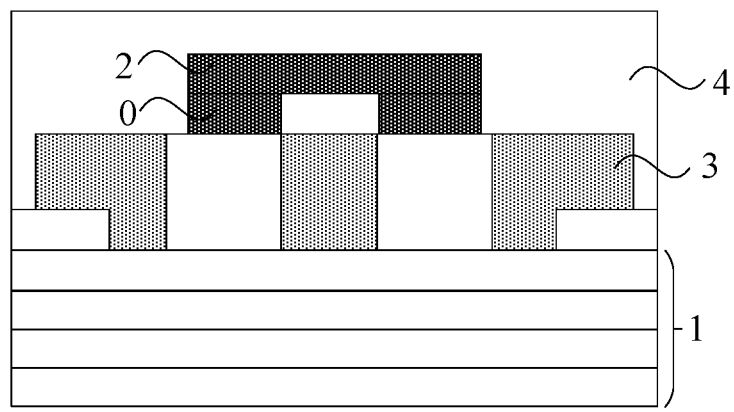
FIG. 1 is a sectional view of a circuit board in the related art according to an embodiment of the present disclosure.

Hereinafter the present disclosure is further described in detail in conjunction with the drawings and embodiments. It is to be understood that the embodiments described herein are intended to illustrate and not to limit the present disclosure. Additionally, it is to be noted that for ease of description, only part, not all, of structures related to the present disclosure are illustrated in the drawings.

FIG. 1 is a sectional view of a circuit board in the related art according to an embodiment of the present disclosure. Referring to FIG. 1, the circuit board in the related art generally includes a substrate 1, a component 2 disposed on a side of the substrate 1, where pins 0 of the component 2 are electrically connected to the substrate 1. The pins 0 of the component 2 are electrically insulated by an insulating ink layer 3. An encapsulation layer 4 is disposed above the component 2 and the insulating ink layer 3. The encapsulation layer 4 entirely covers the exposed component 2 and protects the component 2. If no moisture enters the encapsulation layer 4, the component 2 is not affected. If moisture enters the encapsulation layer 4, the component 2 is corroded, and the normal performance of the component 2 is affected. Whether the moisture enters the circuit board cannot be observed visually when a waterproof performance test is performed on the circuit board with the preceding structure. Thus, whether the component 2 is corroded by the moisture can only be determined through a power-on test.

In view of this, the inventors propose the technical solutions in the present application. Specifically, a circuit board according to the present application includes a substrate, an insulating ink layer, a component, and an encapsulation layer.

The insulating ink layer is disposed on the substrate.

The component is disposed on a side of the insulating ink layer facing away from the substrate, and the component is electrically connected to the substrate through a window opening area on the substrate.

The encapsulation layer is disposed on a side of the component facing away from the substrate. The insulating ink layer includes a first hydrochromic material, in a case where humidity exceeds a first humidity threshold, the first hydrochromic material changes from a first color to a second color.

With the preceding solution, when a waterproof performance test is performed on the circuit board, whether moisture enters the circuit board can be preliminarily determined according to a color change situation inside the circuit board without powering on the circuit board for performance tests one by one, thereby bringing convenience to the waterproof performance test, simplifying the process of the waterproof performance test of the circuit board, and reducing the cost of the waterproof performance test of the circuit board.

The above is the core idea of the present disclosure. Technical solutions in embodiments of the present disclosure are described clearly and completely hereinafter in conjunction with the drawings in the embodiments of the present disclosure. Based on the embodiments of the present disclosure, all other embodiments obtained by those of ordinary skill in the art without creative work are within the protection scope of the present disclosure.

Figure 2:
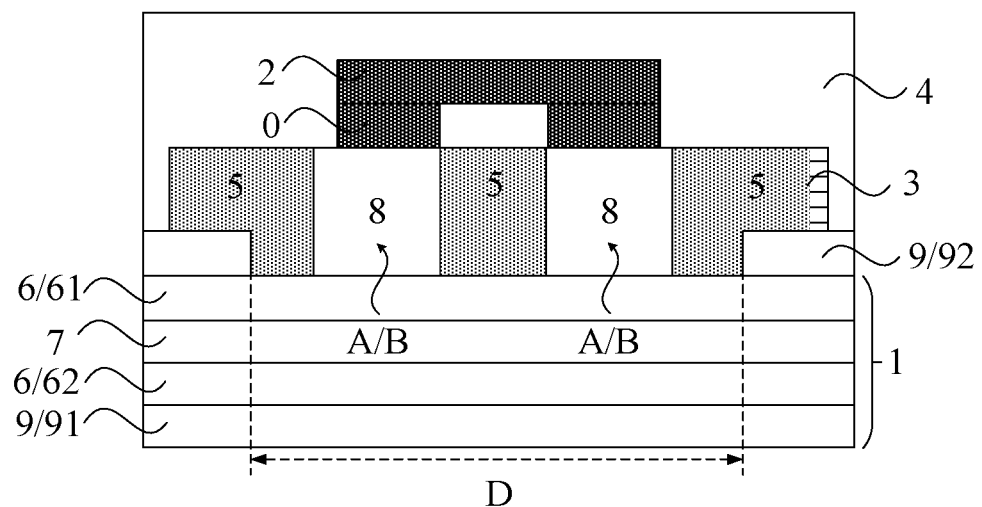
FIG. 2 is a sectional view of a circuit board according to an embodiment of the present disclosure.

FIG. 2 is a sectional view of a circuit board according to an embodiment of the present disclosure. Referring to FIG. 2, the circuit board according to the present application includes a substrate 1, an insulating ink layer 3, a component 2, and an encapsulation layer 4, where the insulating ink layer 3 is disposed on the substrate 1; the component 2 is disposed on a side of the insulating ink layer 3 facing away from the substrate 1, and the component 2 is electrically connected to the substrate 1 through a window opening area A on the substrate 1; the encapsulation layer 4 is disposed on a side of the component 2 facing away from the substrate 1; and the insulating ink layer 3 includes a first hydrochromic material 5, in a case where humidity exceeds a first humidity threshold, the first hydrochromic material 5 changes from a first color to a second color.

Specifically, as shown in FIG. 2, the circuit board is provided with the substrate 1, the insulating ink layer 3, the component 2, and the encapsulation layer 4. The substrate 1 may include at least one substrate layer 7 and at least one conductive layer 6. For example, the substrate 1 may include one substrate layer 7 and a conductive layer 6 disposed on a side of the substrate layer 7. In this case, the circuit board is a single-layer circuit board. The substrate 1 may include the substrate layer 7 and a first conductive layer 61 and a second conductive layer 62 disposed on two sides of the substrate layer 7 (as shown in FIG. 2). In this case, the circuit board is a double-layer circuit board. Of course, in practical application, the structure of the substrate 1 is not limited thereto. The substrate 1 may be provided with multiple substrate layers 7 and conductive layers 6 stacked in sequence so that a multiple-layer circuit board is formed, which is not described in detail in the present application. Those skilled in the art may select a substrate 1 of any structure according to actual needs.

The substrate layer 7 may be a flexible substrate layer, for example, may be, but is not limited to, a thin film of polyimide or a thin film of polyester. The substrate layer 7 may be a rigid substrate layer, for example, may be, but is not limited to, a phenolic resin paper laminate, an epoxy laminate, a polyester interlayer glass mat laminate, or an epoxy glass cloth laminate. The conductive layer 6 may be a copper foil layer, a copper-nickel alloy layer, or a conductive paint layer. The copper foil layer may be an electrolytic copper foil layer or a calendered copper foil layer. The conductive paint layer is formed of a conductive paint. The conductive paint is a slurry composed of a mixture of a conductive material (such as silver or carbon) and a polymer adhesive (such as a resin). The conductive layer 6 may include conductive lines (not shown in the figure). The conductive lines may be formed through, but not limited to, pattern etching of the conductive layer 6. Specific formation manners of the conductive layer 6 and the conductive lines are not described in detail or limited in the embodiment of the present disclosure.

Additionally, thickness parameters of films of the substrate 1 are not limited in the embodiment of the present disclosure and may be set by those skilled in the art according to actual needs.

With continued reference to FIG. 2, the substrate 1 also includes the window opening area A, which refers to an area where the substrate 1 and pins 0 of the component 2 are electrically connected and bonded. The insulating ink layer 3 is also disposed on a surface of the substrate 1 (a surface of the first conductive layer 61 facing away from the substrate layer 7 in FIG. 2). The insulating ink layer 3 covers part of the conductive lines on the surface of the substrate 1, preventing the conductive lines from being corroded or damaged for being exposed in air. It is to be noted that since the window opening area A is used for being bonded to the component 2 subsequently, the insulating ink layer 3 should not be disposed within the window opening area A, that is, the window opening area A of the substrate 1 is not covered by the insulating ink layer 3. In this manner, the insulating ink layer 3 can also act as a solder mask, preventing a short circuit between the conductive lines or between components 2.

The component 2 is disposed on the side of the insulating ink layer 3 facing away from the substrate 1. The component 2 may be an integrated circuit chip, a capacitor, a resistor, a boost component, a flash memory, a connecting base, or a plug-in assembly. The pins 0 of the component 2 are electrically connected to the conductive layer 6 of the substrate 1 exposed by the window opening area A so that the component 2 is electrically connected to a conductive line in the substrate 1. Optionally, the component 2 may be electrically connected to the conductive layer 6 of the substrate 1 by solder paste 8, but it is not limited thereto. In practical application, those skilled in the art may select any welding technique to achieve an electrical connection between the component 2 and the substrate 1 according to actual needs.

Additionally, a specific preparation manner of the insulating ink layer 3 is not limited in the embodiment of the present disclosure and may be set by those skilled in the art according to actual needs. For example, in a possible embodiment, a liquid insulating ink material may be coated on the upper surface of the substrate 1, and then insulating ink is cured. Alternatively, the insulating ink layer 3 may be prepared through a screen printing technique, but it is not limited thereto.

As mentioned above, the insulating ink layer 3 is not disposed within the window opening area A, that is, the insulating ink layer 3 includes a hollowed-out area B. A projection of the hollowed-out area B coincides with a projection of the window opening area A in the direction perpendicular to the surface of the substrate 1, that is, the hollowed-out area B corresponds to the window opening area A of the substrate 1, and the pins 0 of the component 2 are electrically connected to the substrate 1 through the hollowed-out area B. In the embodiment of the present application, when the insulating ink layer 3 is prepared, the entire layer of the insulating ink layer 3 may be prepared and then patterned to form the hollowed-out area B. In this manner, the positional accuracy of the hollowed-out area B (or the window opening area A) can be improved, thereby improving the quality of the circuit board. Alternatively, the insulating ink layer 3 may be prepared only on part of the surface of the substrate 1, and the area not covered by the insulating ink layer 3 corresponds to the window opening area A, thereby reducing process steps and improving the manufacturing efficiency of the circuit board. Additionally, a size, shape, and position of the window opening area A and the number of window opening areas A may be set by those skilled in the art according to actual needs and are not described in detail or limited in the embodiment of the present disclosure.

Further, with continued reference to FIG. 2, the encapsulation layer 4 is disposed on the side of the component 2 facing away from the substrate 1; the encapsulation layer 4 covers the component 2 and the insulating ink layer 3 and provides overall protection for the component 2 and the conductive layer 6 inside the substrate 1, preventing damage to a line or the component 2 inside the circuit board. In the present application, the side of the insulating ink layer 3 facing away from the substrate 1 may be defined as the surface of the insulating ink layer 3, and the side of the component 2 facing away from the substrate 1 may be defined as the surface of the component 2.

A specific setting manner of the encapsulation layer 4 is not limited in the embodiment of the present disclosure and may be selected by those skilled in the art according to actual needs. For example, in a possible embodiment, the encapsulation layer 4 may be, but is not limited to, a glue layer or a fluorinated liquid coating. The glue layer may be an organic silicon potting glue, an epoxy resin potting glue, or a polyurethane potting glue. The glue layer may be prepared by a dispensing technique. A fluorinated liquid is a colorless and transparent substance. The fluorinated liquid is cured so that the fluorinated liquid coating is formed. The fluorinated liquid coating has good chemical inertness and does not cause any corrosion to the component 2 when in contact with an electronic component 2. The fluorinated liquid coating is used for encapsulating the circuit board so that the circuit board can be protected from damage and the thickness of the circuit board can be reduced. The specific setting manner of the encapsulation layer 4 in practice is not limited to this, and a suitable encapsulation manner may be selected by those skilled in the art according to actual needs, which is not described in detail in the present application.

When the waterproof performance test is performed on the circuit board, moisture may pass through the encapsulation layer 4 and enter the circuit board, causing damage to the component 2 and the conductive line. Thus, the component 2 and the conductive line fail. To visually determine whether the moisture enters the circuit board, the first hydrochromic material 5 is provided in the insulating ink layer 3 in the present application, where the first hydrochromic material 5 changes a color when in contact with water. A pattern filled with horizontal lines inside the insulating ink layer 3 in FIG. 2 represents the first hydrochromic material 5, but the pattern does not represent the actual structure of the first hydrochromic material 5.

Specifically, the first hydrochromic material 5 changes from the first color to the second color when the humidity in contact with the first hydrochromic material 5 exceeds the first humidity threshold. The first color may be understood as a color of the first hydrochromic material 5 before it is in contact with the moisture, and the second color may be understood as a color of the first hydrochromic material 5 after it is in contact with the moisture. The first humidity threshold is used for characterizing whether the first hydrochromic material 5 is in contact with the moisture. It may also be understood as that the first hydrochromic material 5 changes from the original first color to the second color after it is in contact with the moisture.

It is to be understood that a humidity value in a current environment can reflect a moisture content in the current environment, and the greater the humidity value, the higher the moisture content in the current environment. Under normal circumstances, no moisture enters the circuit board, and a humidity value of the insulating ink layer 3 should be relatively low. The first hydrochromic material 5 in the insulating ink layer 3 is not in contact with the moisture and is in the first color. During the waterproof performance test, if no moisture enters the circuit board, the first hydrochromic material 5 still maintains the first color. If the moisture enters the circuit board, the moisture passes through the encapsulation layer 4, enters the insulating ink layer 3, and is in contact with the first hydrochromic material 5, and the humidity value of the insulating ink layer 3 (or the humidity value in contact with the first hydrochromic material 5) increases. The relatively large humidity value is the first humidity threshold. At this time, the first hydrochromic material 5 changes to the second color.

It is to be noted that the first humidity threshold is not a fixed value and is related to parameters such as a type and a concentration of the first hydrochromic material. A specific value of the first humidity threshold is not limited in the present application. When a specific design parameter of the first hydrochromic material 5 is different, the magnitude of the first humidity threshold is also different.

In the present application, when the waterproof performance test is performed on the circuit board, whether the moisture enters the circuit board can be determined visually based on whether the first hydrochromic material 5 changes the color. If the first hydrochromic material 5 does not change the color, it indicates that no moisture enters the circuit board, and the component 2 and the conductive line are not corroded. If the first hydrochromic material 5 changes the color, it indicates that the moisture enters the circuit board, the component 2 and the conductive line may be corroded, and thus performance tests need to be further performed on the circuit board. In this manner, testing personnel can preliminarily determine whether the moisture enters the circuit board through visual observation without powering on the circuit board for performance tests one by one, thereby bringing convenience to the waterproof performance test, simplifying the process of the waterproof performance test of the circuit board, and reducing the cost of the waterproof performance test of the circuit board.

Figure 3:
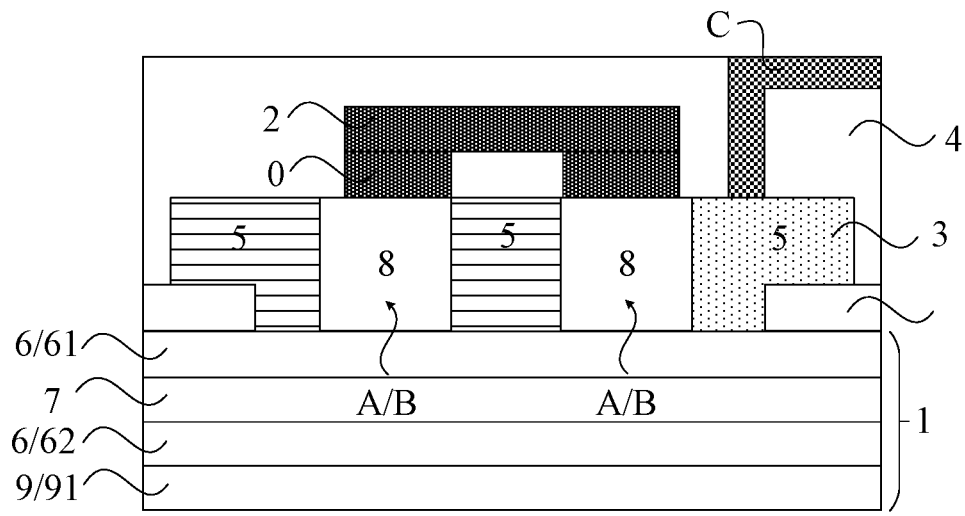
FIG. 3 is a schematic view of moisture entering a circuit board according to an embodiment of the present disclosure.

FIG. 3 is a schematic view of moisture entering a circuit board according to an embodiment of the present disclosure. Referring to FIG. 3, moisture C passes through the encapsulation layer 4 and enters the insulating ink layer 3, causing the humidity of the insulating ink layer 3 to increase to a value higher than or equal to the first humidity threshold. The first hydrochromic material 5 changes from the first color (represented by a pattern filled with horizontal lines and dots) to the second color (represented by a pattern filled with dots) when the humidity in contact with the first hydrochromic material 5 increases. In FIG. 3, the first hydrochromic material 5 in contact with the moisture C changes the color, and the first hydrochromic material 5 that is not in contact with the moisture C does not change the color. The circuit board according to the embodiment of the present disclosure includes the substrate, the insulating ink layer disposed on the substrate, the component disposed on the side of the insulating ink layer facing away from the substrate, where the component is electrically connected to the substrate through the window opening area on the substrate; and the encapsulation layer disposed on the side of the component facing away from the substrate. The insulating ink layer includes the first hydrochromic material, where the first hydrochromic material changes from the first color to the second color after the humidity of the first hydrochromic material exceeds the first humidity threshold. With the preceding solution, when a waterproof performance test is performed on the circuit board, whether moisture enters the circuit board can be preliminarily judged according to a color change situation inside the circuit board without powering on the circuit board for performance tests one by one, thereby bringing convenience to the waterproof performance test, simplifying the process of the waterproof performance test of the circuit board, and reducing the cost of the waterproof performance test of the circuit board.

Optionally, with continued reference to FIG. 2, the circuit board according to the embodiment of the present application may also include at least one covering film 9. The direction in which the films of the substrate 1 are stacked may be defined as an up and down direction. The covering film 9 may be disposed on the outmost upper or lower side or the outmost upper and lower sides of the substrate 1. The covering film 9 is an insulating material and can protect the conductive lines inside the substrate 1. In the embodiment shown in FIG. 2, two covering films 9 are included, where a first covering film 91 is located on a side of the substrate 1 facing away from the insulating ink layer 3, and a second covering film 92 is located on a side of the substrate 1 facing the insulating ink layer 3. In this setting manner, an opening D may be set in the second covering film 92, and the first conductive layer 61 is exposed at the opening D. The window opening area A of the substrate 1 is located within the opening D. The second covering film 92 is located between the substrate 1 and the insulating ink layer 3, thereby improving the encapsulation effect of the circuit board. In other embodiments not shown, the covering film 9 may include only the first covering film 91 located on the side of the substrate 1 facing away from the insulating ink layer 3. In this case, the first conductive layer 61 of the substrate 1 except the window opening area A is covered only by the insulating ink layer 3, which can reduce one preparation step. The covering film 9 may be formed through hot pressing of a polyester material or may be etched on the surface of the substrate 1 in a spray coating manner. A specific preparation technique of the covering film 9 may be selected by those skilled in the art according to actual needs and is not described in detail in the present application. Additionally, the type of the first hydrochromic material 5 and the distribution of the first hydrochromic material 5 in the insulating ink layer 3 are not limited in the embodiment of the present disclosure and are selected by those skilled in the art. When the type and other parameters of the first hydrochromic material 5 are different, actual colors of the first color and the second color are also different. Additionally, it is to be noted that the second color does not refer to a fixed color. When the humidity in contact with the first hydrochromic material 5 is different, the first hydrochromic material 5 may change the color to a different degree. For example, the first hydrochromic material 5 may be anhydrous copper sulfate, anhydrous cobalt chloride, or sodium peroxide. Anhydrous copper sulfate changes from white to blue when in contact with water, and anhydrous cobalt chloride changes from dark blue to pink when in contact with water. In practical application, the first hydrochromic material 5 is not limited thereto, which is not listed one by one in the embodiment of the present disclosure.

Optionally, in a possible embodiment, it may be set that the encapsulation layer 4 and the insulating ink layer 3 are both transparent films so that the first hydrochromic material 5 changes the color more obviously.

Optionally, in a possible embodiment, the first hydrochromic material 5 can resist a high-temperature environment with a first temperature value, where the first temperature value is a welding temperature of the component 2 in a soldering furnace.

The process of the entire preparation technique of the circuit board may be briefly described as follows: the substrate 1 is provided, the insulating ink layer 3 is prepared on a side of the substrate 1, and the component 2 is electrically connected to the conductive layer 6 of the substrate 1. Surface mounting technology (SMT) is widely used for welding the component 2. When the component 2 is electrically connected to the substrate 1 by using the SMT, the solder paste 8 may be firstly coated on the window opening area A, the pins 0 of the component 2 are attached to the solder paste 8, the component 2 and the substrate 1 are placed in the soldering furnace, and the solder paste 8 is melted at a high temperature so that the component 2 is electrically connected to the substrate 1. It can be seen that the preparation process of the insulating ink layer 3 is performed before the component 2 is mounted. Therefore, in this embodiment, to avoid an effect of the welding temperature in the soldering furnace on the performance of the first hydrochromic material 5, it may be set that the first hydrochromic material 5 resists a high temperature.

Specifically, it may be set that the hydrochromic performance of the first hydrochromic material 5 does not change at the welding temperature. The welding temperature may be defined as the first temperature value, that is, after undergoing the high-temperature environment with the first temperature value, the first hydrochromic material 5 can still change from the first color to the second color when the humidity of the environment where the first hydrochromic material 5 is located exceeds the first humidity threshold.

Optionally, in a possible embodiment, the first hydrochromic material 5 may be anhydrous copper sulfate. Anhydrous copper sulfate can resist a high temperature of about 600° C. Generally, the welding temperature is about 260° C. Thus, the welding temperature does not affect the hydrochromic performance of anhydrous copper sulfate.

Of course, the first hydrochromic material 5 is not limited thereto. Any material that is hydrochromic and can resist a high temperature of about 260° C. is within the scope of the technical solution protected by the embodiment of the present disclosure.

Optionally, in a possible embodiment, when the humidity changes, at least part of the first hydrochromic material 5 maintains a color at a highest humidity.

Specifically, in this embodiment, when the humidity of the environment where the first hydrochromic material 5 is located changes, the first hydrochromic material 5 can maintain the color at the highest humidity in contact with the first hydrochromic material 5. In other words, the color change situation of the first hydrochromic material 5 is irreversible to some extent. For example, when the humidity of the environment rises from below the first humidity threshold to above the first humidity threshold, the first hydrochromic material 5 changes to the second color. The second color may refer to the color at the highest humidity in contact with the first hydrochromic material 5. At this time, if the humidity of the environment starts to decrease from the highest humidity, the first hydrochromic material 5 does not change back to the first color; instead, it maintains the second color. In this setting manner, even if the moisture inside the circuit board evaporates and the humidity value inside the circuit board decreases after the circuit board product is taken out of a test environment for a while, the first hydrochromic material 5 can still maintain the changed color so that the testing personnel can accurately distinguish the circuit board which the moisture enters, avoiding the case where the testing personnel cannot distinguish the circuit board which the moisture enters from one in which no moisture enters after the moisture evaporates.

Additionally, since the moisture entry situation may differ in different areas of the circuit board, some areas may have moisture, while others may have no moisture during the waterproof performance test. The first hydrochromic material 5 changes the color in the area where the moisture enters, and the first hydrochromic material 5 does not change the color in the area where no moisture enters. In this manner, the area of the circuit board product which the moisture enters can be determined visually. Optionally, in this embodiment, the first hydrochromic material may still be anhydrous copper sulfate. The color change of anhydrous copper sulfate after in contact with water is irreversible, which meets practical application needs.

In other possible embodiments, the first hydrochromic material 5 may be a material with a reversible color change. When the material with the reversible color change is used as the first hydrochromic material 5, the color change situation inside the circuit board needs to be checked immediately within a short time after the product is taken out of the test environment.

Optionally, in a possible embodiment, in a case where the humidity exceeds the first humidity threshold, the first hydrochromic material 5 changes the color to different degrees in different humidity ranges.

Specifically, in this embodiment, it may be set that the first hydrochromic material 5 has different color change situations at different humidity, that is, when the moisture content in contact with the first hydrochromic material 5 is different, the color change situation of the first hydrochromic material 5 is different. In this manner, the degrees to which the moisture enters the circuit board can be determined according to the color change situations in different areas of the circuit board, and then a leakage position (that is, a moisture entry path) of the circuit board can be determined according to the color change situations so that the technique and process of the circuit board can be adjusted according to the leakage position of the product.

With anhydrous copper sulfate as an example, if the moisture content in contact with anhydrous copper sulfate is relatively low (that is, the humidity of the environment is slightly higher than the first humidity threshold), anhydrous copper sulfate changes the color to a relatively small degree (changes to light blue); if the moisture content in contact with anhydrous copper sulfate is relatively high (that is, the humidity of the environment is far higher than the first humidity threshold), anhydrous copper sulfate changes the color to a relatively large degree (changes to dark blue). An area of the circuit board having a darker color is closer to the moisture entry path, while an area with a lighter color is further away from the moisture entry path; thus, the leakage position of the circuit board can be preliminarily determined.

With continued reference to FIG. 2, in a possible embodiment, the first hydrochromic material 5 may be distributed in the insulating ink layer 3.

Specifically, as shown in FIG. 2, it may set that the first hydrochromic material 5 is uniformly distributed in the insulating ink layer 3. In this setting manner, the dispersion of the first hydrochromic material 5 in the insulating ink layer 3 is relatively uniform. The moisture entry situations in different areas of the insulating ink layer 3 may be determined according to the color change of the first hydrochromic material 5. In FIG. 2, the pattern filled with horizontal lines in the insulating ink layer 3 represents the dispersion of the first hydrochromic material 5 in the insulating ink layer 3.

The first hydrochromic material 5 may be added to liquid insulating ink and mixed uniformly. Then, the insulating ink with the first hydrochromic material 5 dispersed is coated on the surface of the substrate 1. After the coating is completed, the insulating ink is cured so that the insulating ink layer 3 with the first hydrochromic material 5 distributed is formed. In this manner, the curing technique of the insulating ink layer 3 can remain unchanged, and the difficulty of curing the insulating ink layer 3 is not increased.

Additionally, in this embodiment, parameters of the first hydrochromic material 5 in the insulating ink layer 3, such as a particle size and/or a distribution concentration, may be limited. For example, it may be set that the particle size of the first hydrochromic material 5 in the insulating ink layer 3 is smaller than a first particle size threshold and/or the distribution concentration of the first hydrochromic material 5 in the insulating ink layer 3 is lower than a first distribution concentration threshold. Within the ranges of the first particle size threshold and the first distribution concentration threshold, the doping of the first hydrochromic material 5 does not affect the normal curing of the insulating ink layer 3.

Specific values of the first particle size threshold and the first distribution concentration threshold are not limited in the embodiment of the present disclosure. When the material selected for the insulating ink layer 3 is different, the first particle size threshold and the first distribution concentration threshold may be different. A suitable first particle size threshold and first distribution concentration threshold may be set by those skilled in the art according to actual situations.

Figure 4:
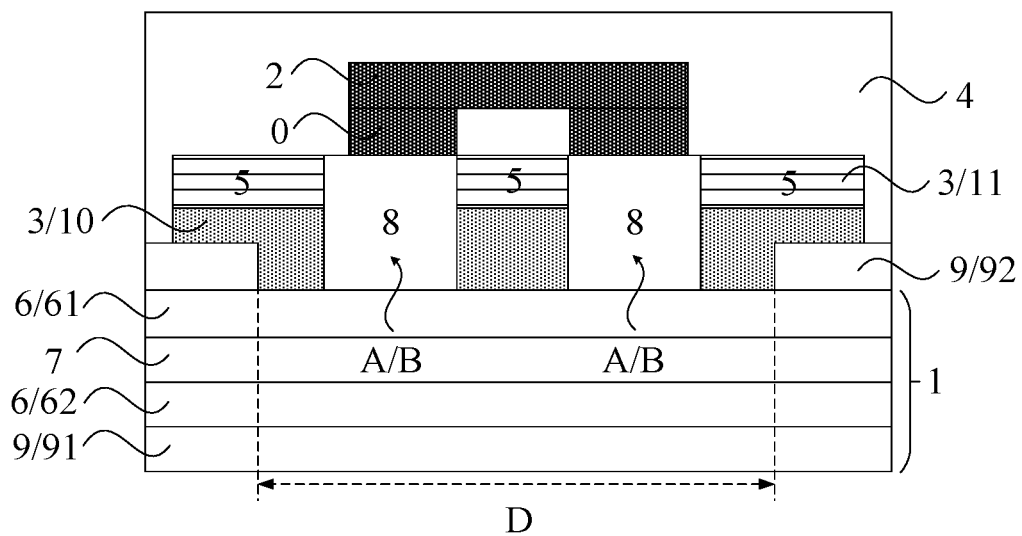
FIG. 4 is a sectional view of another circuit board according to an embodiment of the present disclosure.

FIG. 4 is a sectional view of another circuit board according to an embodiment of the present disclosure. Referring to FIG. 4, in other possible embodiments, the insulating ink layer 3 may include an insulating coating 10 and a first hydrochromic layer 11, where the first hydrochromic layer 11 is located on a side of the insulating coating 10 facing away from the substrate 1, and the first hydrochromic layer 11 includes the first hydrochromic material 5.

Specifically, as shown in FIG. 4, in this embodiment, the insulating ink layer 3 may be composed of the insulating coating 10 and the first hydrochromic layer 11 that are stacked. The insulating coating 10 may be coated on the surface of the substrate 1, where the insulating coating 10 is the insulating ink layer 3 in the related art. Then, the first hydrochromic layer 11 is coated on a surface of the insulating coating 10 facing away from the substrate 1. The first hydrochromic material 5 is distributed in the first hydrochromic layer 11. In this setting manner, the entire first hydrochromic material 5 is distributed on a side of the insulating ink layer 3 facing the encapsulation layer 4. After the moisture passes through the encapsulation layer 4, the moisture enters the first hydrochromic layer 11 and causes the first hydrochromic material 5 to change the color.

Optionally, in this embodiment, the first hydrochromic material 5 may be uniformly mixed with an organic glue and then coated on a surface of the insulating coating 10. The organic glue does not contain water and does not cause the first hydrochromic material 5 to change the color. Of course, the setting manner of the first hydrochromic layer 11 is not limited thereto and may be selected by those skilled in the art according to actual needs.

Figure 5:
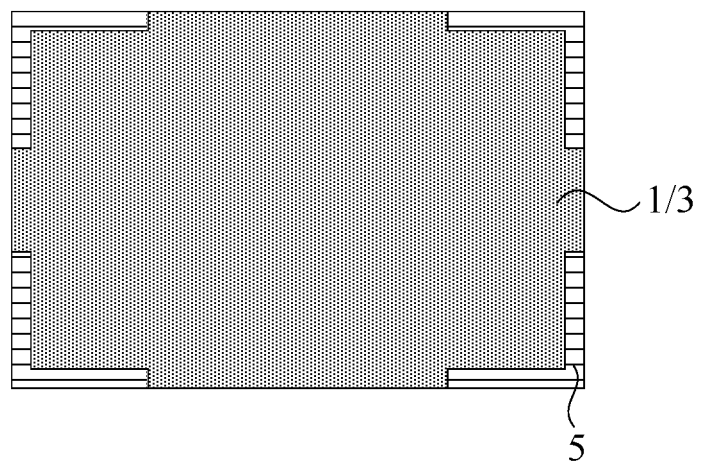
FIG. 5 is a top view of a circuit board according to an embodiment of the present disclosure.

FIG. 5 is a top view of a circuit board according to an embodiment of the present disclosure. Optionally, referring to FIG. 5, in a possible embodiment, the first hydrochromic material 5 may be disposed in at least part of an edge area of the substrate 1.

Specifically, in the embodiment shown in FIG. 5, the first hydrochromic material 5 may be disposed only in part of the edge area of the substrate 1. Since the moisture easily enters the edge area of the circuit board, in this embodiment, the first hydrochromic material 5 may be disposed only in the insulating ink layer 3 corresponding to an edge of the substrate 1. The setting cost of the insulating ink layer 3 is reduced on the basis that whether moisture enters can be accurately identified.

Figure 6:
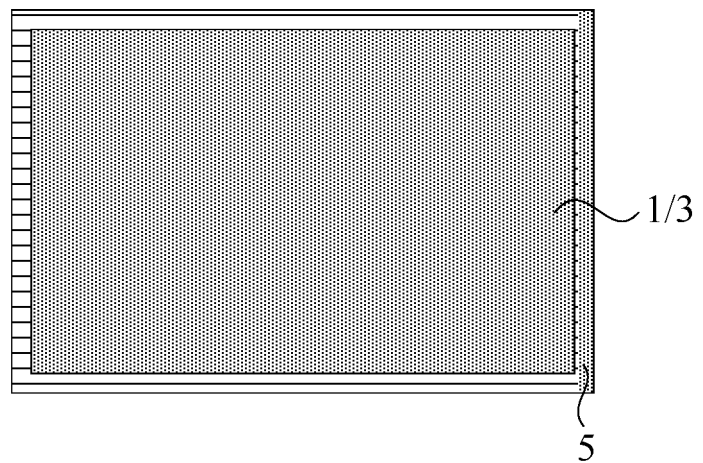
FIG. 6 is a top view of another circuit board according to an embodiment of the present disclosure.

FIG. 6 is a top view of another circuit board according to an embodiment of the present disclosure. Optionally, referring to FIG. 6, in another possible embodiment, the first hydrochromic material 5 may be disposed around the edge area of the substrate 1.

Specifically, in the embodiment shown in FIG. 6, the first hydrochromic material 5 may be disposed in the insulating ink layer 3 corresponding to the edge of the substrate 1, that is, an orthographic projection of the overall structure of the first hydrochromic material 5 on the substrate 1 surrounds the edge of the substrate 1. In this setting manner, the color change situation of the first hydrochromic material 5 can reflect the moisture entry situation around the edge of the circuit board.

Figure 7:
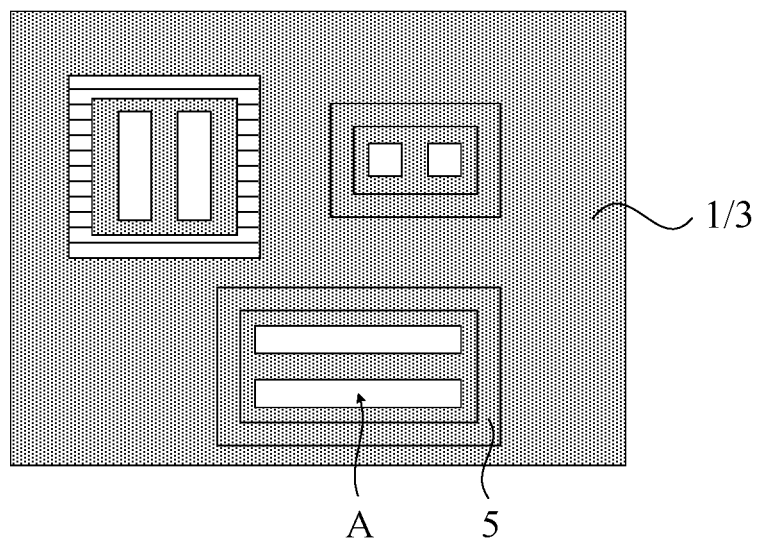
FIG. 7 is a top view of another circuit board according to an embodiment of the present disclosure.

FIG. 7 is a top view of another circuit board according to an embodiment of the present disclosure. Optionally, referring to FIG. 7, in another possible embodiment, the first hydrochromic material 5 may be disposed around the window opening area A.

Specifically, as shown in FIG. 7, the first hydrochromic material 5 may be disposed at an edge of the insulating ink layer 3 corresponding to the window opening area A of the substrate 1 so that the orthographic projection of the overall structure of the first hydrochromic material 5 on the substrate 1 surrounds the window opening area A. Since the window opening area A is used for being bonded to the component 2, a high humidity requirement is put on the window opening area A and an edge of the window opening area A. The first hydrochromic material 5 is disposed around the window opening area A so that the moisture entry situation around the pins 0 of the component 2 can be accurately reflected.

In the embodiments shown in FIGS. 5 to 7, the first hydrochromic material 5 may be distributed in the insulating ink layer 3 in corresponding areas. Alternatively, the insulating coating 10 may be formed, and then the first hydrochromic layer 11 may be prepared on the surface of the insulating coating 10 in the corresponding areas. Specific implementation manners of the preceding two solutions are the same as those in the preceding embodiment and are not repeated here.

Additionally, in the embodiment of the present disclosure, only a window opening area A in the shape of a square is used as an example, and the actual shape of the window opening area A is not limited thereto. In other embodiments not shown, the shape of the window opening area A may be a circle or a polygon.

Figure 8:
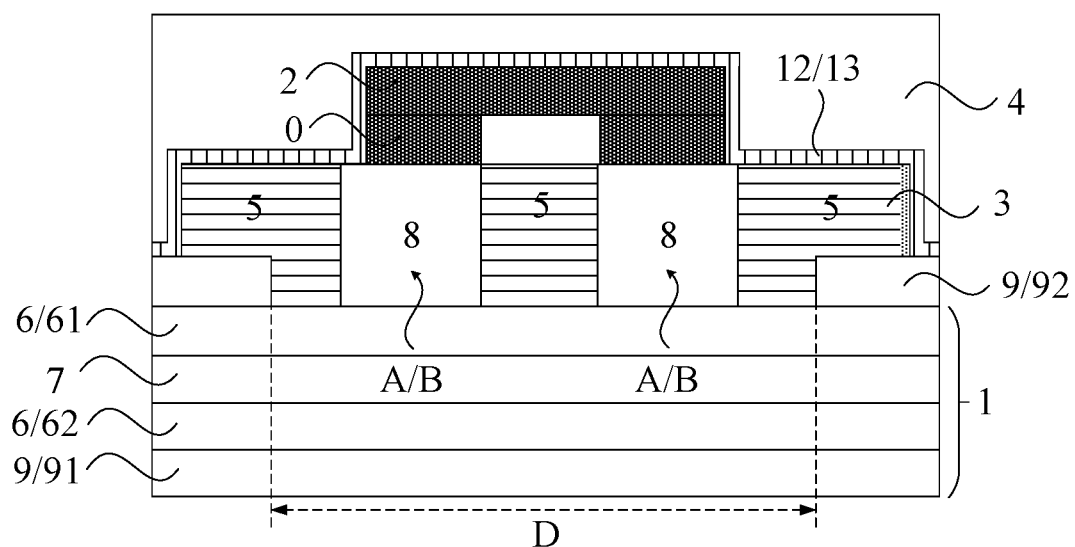
FIG. 8 is a sectional view of another circuit board according to an embodiment of the present disclosure.

Optionally, FIG. 8 is a sectional view of another circuit board according to an embodiment of the present disclosure. Referring to FIG. 8, in a possible embodiment, the circuit board may also include a second hydrochromic layer 12 disposed on the side of the component 2 facing away from the substrate 1, where the second hydrochromic layer 12 includes a second hydrochromic material 13, and in a case where humidity exceeds a second humidity threshold, the second hydrochromic material 13 changes from a third color to a fourth color.

Specifically, as shown in FIG. 8, the circuit board is also provided with the second hydrochromic layer 12, where the second hydrochromic layer 12 is provided with the second hydrochromic material 13. When the humidity of the environment where the second hydrochromic material 13 is located exceeds the second humidity threshold, the second hydrochromic material 13 changes from the third color to the fourth color. The third color may be understood as a color of the second hydrochromic material 13 before it is in contact with the moisture, and the fourth color may be understood as a color of the second hydrochromic material 13 after it is in contact with the moisture. The second humidity threshold is used for characterizing whether the second hydrochromic material 13 is in contact with the moisture. It may also be understood as that the second hydrochromic material 13 changes from the original third color to the fourth color after it is in contact with the moisture. A pattern filled with vertical lines between the component 2 (the insulating ink layer 3) and the encapsulation layer 4 represents the second hydrochromic material 13, but the pattern does not represent the actual structure of the second hydrochromic material 13.

Similarly, the second humidity threshold is not a fixed value and is related to parameters such as a type and a concentration of the second hydrochromic material. A specific value of the second humidity threshold is not limited in the present application. When a specific setting parameter of the second hydrochromic material 13 is different, the magnitude of the second humidity threshold is also different.

The second hydrochromic layer 12 may be disposed on the side of the component 2 facing away from the substrate 1. In this manner, the preparation process of the second hydrochromic layer 12 is after the welding process of the component 2. Therefore, in this embodiment, the second hydrochromic material 13 does not need to resist a high temperature, thereby reducing the preparation cost of the circuit board. Optionally, the second hydrochromic material 13 may be any one of anhydrous copper sulfate and anhydrous cobalt chloride mentioned in the preceding embodiment, but it is not limited thereto.

In this embodiment, the second hydrochromic layer 12 is disposed in the circuit board. Whether the moisture enters the encapsulation layer 4 can be determined according to the color change situation of the second hydrochromic layer 12. Since the encapsulation layer 4 is closer to an outer layer of the circuit board, when part of the second hydrochromic layer 12 changes from the third color to the fourth color, it indicates that the moisture enters the encapsulation layer 4 corresponding to this area and the encapsulation layer 4 may be damaged or has a leakage.

For example, with continued reference to FIG. 8, in a possible embodiment, the second hydrochromic layer 12 may be disposed between the component 2 and the encapsulation layer 4.

Specifically, as shown in FIG. 8, as an optional embodiment, the second hydrochromic layer 12 may be prepared on the side of the component 2 facing away from the substrate 1 after the component 2 is electrically connected to the substrate 1. The second hydrochromic layer 12 covers the insulating ink layer 3 and the component 2, and the encapsulation layer 4 covers the second hydrochromic layer 12. In this manner, when the humidity of a partial area of the encapsulation layer 4 exceeds the second humidity threshold, the testing personnel can visually observe a color change of the second hydrochromic layer 12 corresponding to this area. This indicates that the encapsulation layer 4 in this area is damaged or have a leakage.

Figure 9:
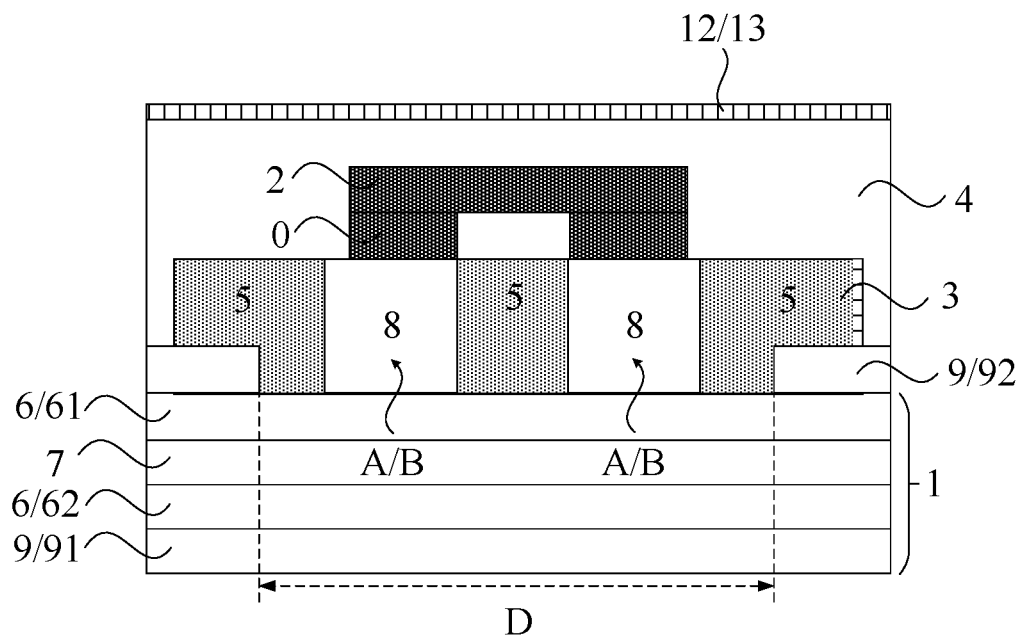
FIG. 9 is a sectional view of another circuit board according to an embodiment of the present disclosure.

For example, FIG. 9 is a sectional view of another circuit board according to an embodiment of the present disclosure. Referring to FIG. 9, in another possible embodiment, the second hydrochromic layer 12 may be disposed on a side of the encapsulation layer 4 facing away from the substrate 1.

Specifically, as shown in FIG. 9, as another optional embodiment, after the encapsulation layer 4 is prepared, the second hydrochromic layer 12 may be prepared on the side of the encapsulation layer 4 facing away from the substrate 1, that is, the second hydrochromic layer 12 covers the outer surface of the encapsulation layer 4. In this manner, the second hydrochromic layer 12 is closer to the outer side of the circuit board, and whether the second hydrochromic layer 12 changes a color can be more clearly observed. Further, the encapsulation effect of the encapsulation layer 4 can be determined according to the color of the second hydrochromic layer 12.

Figure 10:
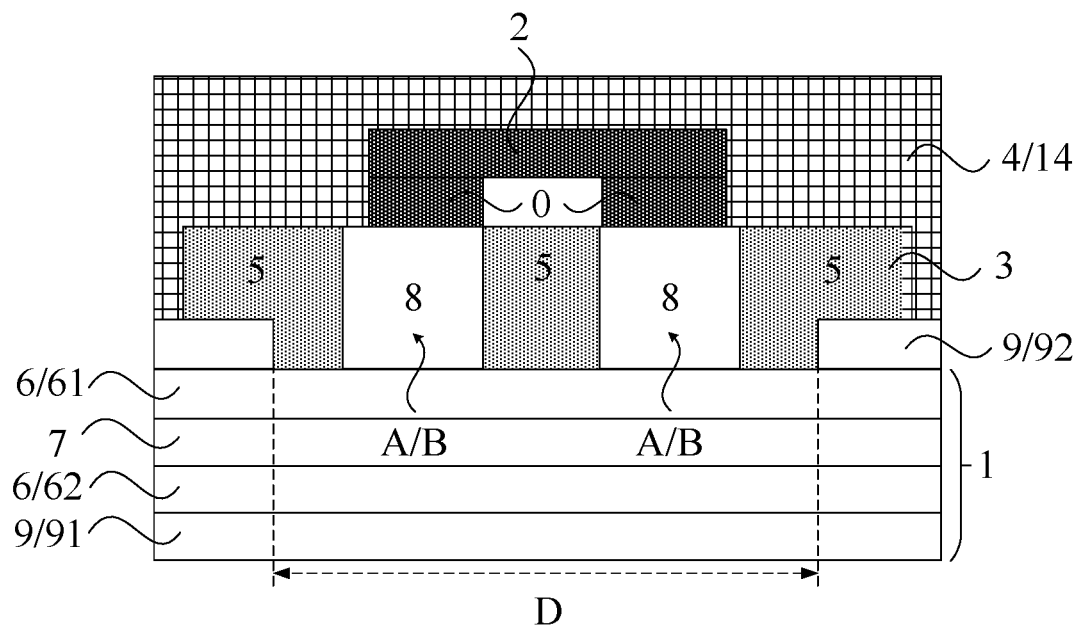
FIG. 10 is a sectional view of another circuit board according to an embodiment of the present disclosure.

Optionally, in the embodiment shown in FIG. 8, the second hydrochromic material 13 may be uniformly mixed with organic glue and then coated on the surface of the component 2 and the insulating ink layer 3. In the embodiment shown in FIG. 9, the second hydrochromic material 13 may be uniformly mixed with the organic glue and then coated on the surface of the encapsulation layer 4. Of course, the setting manner of the second hydrochromic layer 12 is not limited thereto and may be selected by those skilled in the art according to actual needs. FIG. 10 is a sectional view of another circuit board according to an embodiment of the present disclosure. Referring to FIG. 10, in another possible embodiment, a third hydrochromic material 14 is distributed in the encapsulation layer 4, in a case where humidity exceeds a third humidity threshold, the third hydrochromic material 14 changes from a fifth color to a sixth color.

Specifically, as shown in FIG. 10, in another optional embodiment, the third hydrochromic material 14 is doped inside the encapsulation layer 4. When the humidity of the environment where the third hydrochromic material 14 is located exceeds the third humidity threshold, the third hydrochromic material 14 changes from the fifth color to the sixth color. The fifth color may be understood as a color of the third hydrochromic material 14 before it is in contact with the moisture, and the sixth color may be understood as a color of the third hydrochromic material 14 after it is in contact with the moisture. The third humidity threshold is used for characterizing whether the third hydrochromic material 14 is in contact with the moisture. It may also be understood as that the third hydrochromic material 14 changes from the original fifth color to the sixth color after it is in contact with the moisture. A pattern filled with rectangles in the encapsulation layer 4 in the figure represents the third hydrochromic material 14, but the pattern does not represent the actual structure of the third hydrochromic material 14.

The third hydrochromic material 14 may be the same as or different from the second hydrochromic material 13. The third humidity threshold is not a fixed value and is related to parameters such as a type and a concentration of the third hydrochromic material. A specific value of the third humidity threshold is not limited in the present application. When a specific setting parameter of the third hydrochromic material 14 is different, the magnitude of the third humidity threshold is also different.

In this setting manner, the third hydrochromic material 14 is uniformly distributed in the encapsulation layer 4, and the moisture entry situations in different areas of the encapsulation layer 4 may be determined according to a color change of the third hydrochromic material 14.

In an example where the encapsulation layer 4 is the glue layer, the third hydrochromic material 14 may be added to a liquid potting glue and mixed uniformly, and then the potting glue with the third hydrochromic material 14 dispersed is coated on the surface of the component 2 and the insulating ink layer 3. After the coating is completed, the potting glue is cured so that the glue layer with the third hydrochromic material 14 distributed is formed. In this manner, the curing technique of the glue layer can remain unchanged, and the difficulty of curing the glue layer is not increased. When the encapsulation layer 4 is the fluorinated liquid coating, the addition manner of the third hydrochromic material 14 may be the same as that in the preceding technique.

Additionally, in this embodiment, parameters of the third hydrochromic material 14 in the encapsulation layer 4, such as a particle size and/or a distribution concentration, may be limited. For example, it may be set that the particle size of the third hydrochromic material 14 in the encapsulation layer 4 is smaller than a second particle size threshold and/or the distribution concentration of the third hydrochromic material 14 in the encapsulation layer 4 is lower than a second distribution concentration threshold. Within the ranges of the second particle size threshold and the second distribution concentration threshold, the doping of the third hydrochromic material 14 does not affect the normal curing of the encapsulation layer 4.

Specific values of the second particle size threshold and the second distribution concentration threshold are not limited in the embodiment of the present disclosure. When the material selected for the encapsulation layer 4 is different, the second particle size threshold and the second distribution concentration threshold may be different. A suitable second particle size threshold and second distribution concentration threshold may be set by those skilled in the art according to actual situations.

Figure 11:
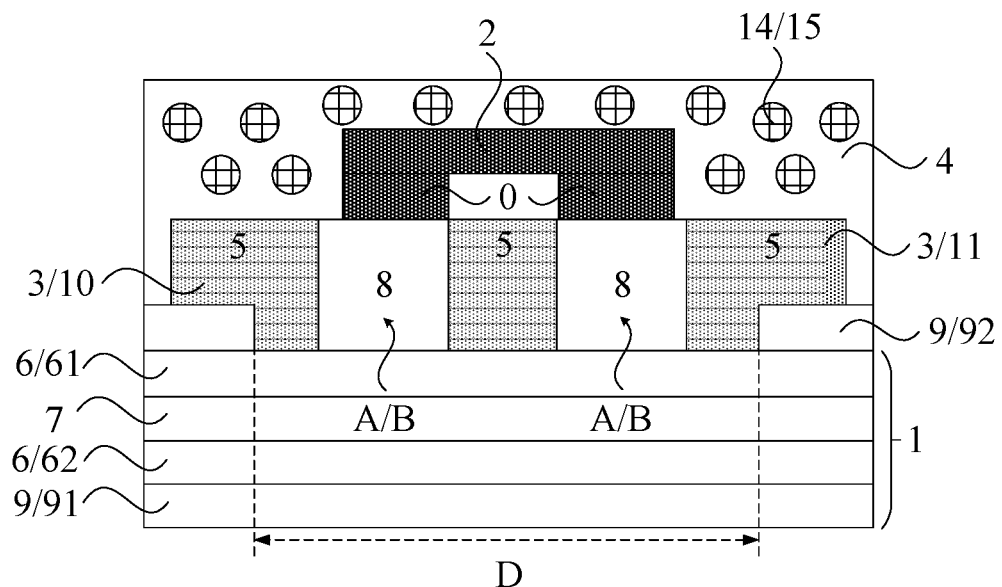
FIG. 11 is a sectional view of another circuit board according to an embodiment of the present disclosure.

Optionally, FIG. 11 is a sectional view of another circuit board according to an embodiment of the present disclosure. Referring to FIG. 11, in a possible embodiment, multiple sealed communication structures 15 are formed in the encapsulation layer 4, where the third hydrochromic material 14 is disposed within at least one of the sealed communication structures 15.

In the embodiment shown in FIG. 11, the third hydrochromic material 14 is also disposed inside the encapsulation layer 4. This embodiment differs from the embodiment shown in FIG. 10 in that in this embodiment, the sealed communication structures 15 each filled with the third hydrochromic material 14 inside are formed, and then the sealed communication structures 15 are embedded inside the encapsulation layer 4. In this manner, when a partial area of the encapsulation layer 4 is damaged or cracks, the moisture enters the sealed communication structure 15 in this area through a crack, causing the third hydrochromic material 14 to change a color.

A specific setting manner of the sealed communication structure 15 is not limited and may be set by those skilled in the art according to actual needs as long as the third hydrochromic material 14 exists in the sealed communication structure 15. Optional preparation manners of the sealed communication structure 15 are described below through several embodiments.

For example, as an optional embodiment, the third hydrochromic material 14 may be mixed with a glue and then cured so that the sealed communication structure 15 with the third hydrochromic material 14 uniformly dispersed is formed. Subsequently, the encapsulation layer 4 is coated, and the sealed communication structures 15 are placed in the uncured encapsulation layer 4. Finally, the encapsulation layer 4 is cured so that the encapsulation layer 4 embedded with the sealed communication structures 15 is obtained.

Figure 12:
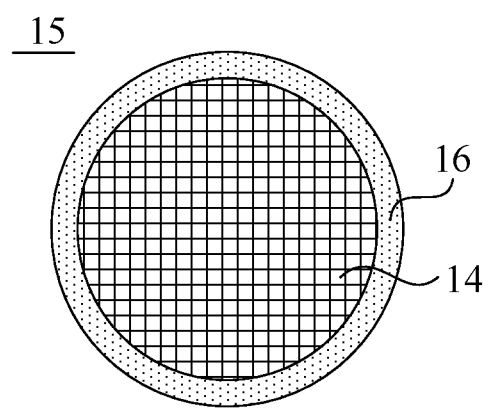
FIG. 12 is a structure diagram of a sealed communication structure according to an embodiment of the present disclosure.

For example, FIG. 12 is a structure diagram of a sealed communication structure according to an embodiment of the present disclosure. Referring to FIG. 12, as another optional embodiment, the sealed communication structure 15 may include a sealing porous film 16 and the third hydrochromic material 14 filled inside the porous film 16. When the encapsulation layer 4 cracks and the moisture permeates the encapsulation layer 4, the moisture penetrates through the porous film 16 and enters the sealed communication structure 15, causing the third hydrochromic material 14 to change the color.

Figure 13:
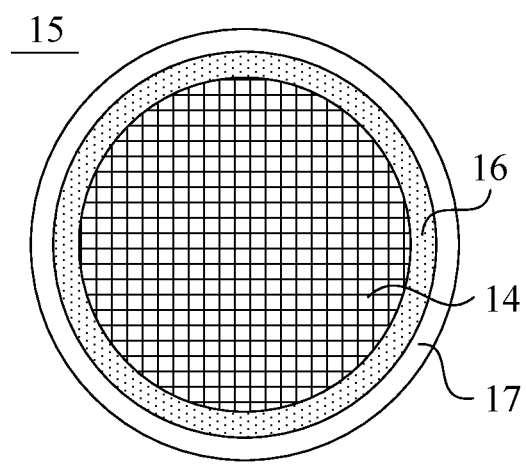
FIG. 13 is a structure diagram of another sealed communication structure according to an embodiment of the present disclosure.

For example, FIG. 13 is a structure diagram of another sealed communication structure according to an embodiment of the present disclosure. The sealed communication structure 15 in the embodiment shown in FIG. 13 is further refined on the basis of the sealed communication structure 15 shown in FIG. 12. Referring to FIG. 13, in this embodiment, the sealed communication structure 15 also includes a water-absorbing film 17 as an outermost layer. The water-absorbing film 17 covers the porous film 16.

The water-absorbing film 17 may be prepared by using a water-soluble material which is a highly hydrophilic polymer material. When the encapsulation layer 4 cracks and the moisture permeates the encapsulation layer 4, the water-absorbing film 17 near the crack is hydrolyzed and damaged, and the moisture penetrates through the porous film 16 and enters the sealed communication structure 15, causing the third hydrochromic material 14 to change the color.

The preceding preparation manners of the sealed communication structure 15 are merely examples and are not intended to limit the technical solutions of the present application. Apart from the preceding technical solutions, any manner in which the desired sealed communication structure 15 can be prepared is within the scope of the technical solutions protected by the embodiments of the present disclosure.

The circuit board according to the embodiment of the present application may be subjected to the waterproof performance test after the process of the preparation technique ends. Additionally, the circuit board according to the embodiment of the present disclosure may also include any structure known to those skilled in the art, which is not described in detail or limited in the embodiment of the present disclosure.

Figure 14:
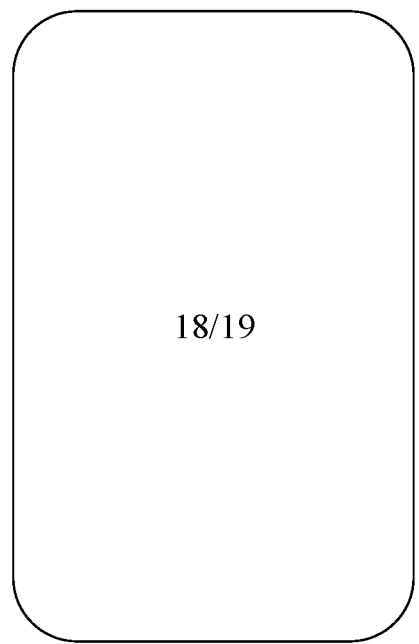
FIG. 14 is a structure diagram of an electronic device according to an embodiment of the present disclosure.
Figure 15:
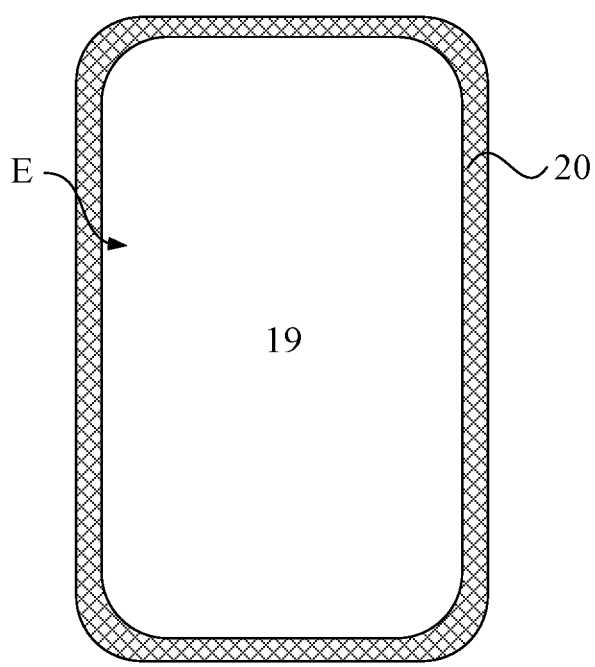
FIG. 15 is a structure diagram of a device housing according to an embodiment of the present disclosure.

Based on the same inventive concept, an embodiment of the present disclosure also provides an electronic device including the circuit board according to any embodiment of the present disclosure. FIG. 14 is a structure diagram of an electronic device according to an embodiment of the present disclosure. FIG. 15 is a structure diagram of a device housing according to an embodiment of the present disclosure. The circuit board is not shown in FIG. 14. Referring to FIGS. 14 and 15, the electronic device also includes a display panel 18 and a device housing 19, where a side of the device housing 19 attached to the display panel 18 is an inner side E of the device housing 19, the inner side E of the device housing 19 is provided with a fourth hydrochromic material 20, and in a case where humidity exceeds a fourth humidity threshold, the fourth hydrochromic material 20 changes from a seventh color to an eighth color.

The electronic device may be, but is not limited to, a mobile phone, a computer, a smart wearable device (for example, a smart watch), and an onboard display device. In the present application, the mobile phone is used as an example of the electronic device. As shown in FIG. 14, the electronic device includes the circuit board (not shown in the figure), the display panel 18, and the device housing 19. The device housing 19 is attached to the display panel 18, and the circuit board may be located in part of an area between the device housing 19 and the display panel 18. The side of the device housing 19 attached to the display panel 18 is defined as the inner side E of the device housing 19, and a side of the device housing 19 facing away from the display panel 18 is defined as an outer side of the device housing 19. In this embodiment, the fourth hydrochromic material 20 may be coated on a part area of the inner side E of the device housing 19. When the humidity of the environment where the fourth hydrochromic material 20 is located exceeds the fourth humidity threshold, the fourth hydrochromic material 20 changes from the seventh color to the eighth color. The seventh color may be understood as a color of the fourth hydrochromic material 20 before it is in contact with moisture, and the eighth color may be understood as a color of the fourth hydrochromic material 20 after it is in contact with the moisture. The fourth humidity threshold is used for characterizing whether the fourth hydrochromic material 20 is in contact with the moisture. It may also be understood as that the fourth hydrochromic material 20 changes from the original seventh color to the eighth color after it is in contact with the moisture. A pattern filled with grids in the figure represents the fourth hydrochromic material 20, but the pattern does not represent the actual structure of the fourth hydrochromic material 20.

Similarly, the fourth hydrochromic material 20 does not need to resist a high temperature, either. The fourth hydrochromic material 20 may be the same as or different from the second hydrochromic material 13 (or the third hydrochromic material 14) in the preceding embodiments. The fourth humidity threshold is not a fixed value and is related to parameters such as a type and a concentration of the fourth hydrochromic material. A specific value of the fourth humidity threshold is not limited in the present application. When a specific setting parameter of the fourth hydrochromic material 20 is different, the magnitude of the fourth humidity threshold is also different.

A waterproof function of the device housing 19 is one of main considerations in product applications. The electronic device according to the embodiment of the present application may be subjected to a waterproof performance test after the end of preparation or whether the moisture enters the electronic device may be determined during an application of a user. The fourth hydrochromic material 20 is disposed on the inner side E of the device housing 19. After the device housing 19 is opened, whether the fourth hydrochromic material 20 changes a color is observed so that whether the waterproof performance of the product fails can be determined. This determination manner is efficient and convenient.

For the coating manner of the fourth hydrochromic material 20, reference may be made to the coating manner of the second hydrochromic material 13 mentioned above, and the coating manner of the fourth hydrochromic material 20 is not repeated here. Additionally, a specific area of the inner side E of the device housing 19 where the fourth hydrochromic material 20 is coated is not limited in the embodiment of the present disclosure and may be set by those skilled in the art according to actual needs.

For example, in a possible embodiment, at least part of an edge area of the inner side E of the device housing 19 includes the fourth hydrochromic material 20.

Specifically, with continued reference to FIG. 15, the fourth hydrochromic material 20 may be coated in at least part of the edge area of the inner side E of the device housing 19. Since the moisture more easily enters the edge area of the device housing 19, in this embodiment, the fourth hydrochromic material 20 may be disposed only in at least part of the edge area of the inner side E of the device housing 19. In this manner, the fourth hydrochromic material 20 is coated in a relatively small area, which does not excessively increase the preparation cost and technique difficulty of the electronic device.

Optionally, with continued reference to FIG. 15, the fourth hydrochromic material 20 may be disposed around the edge area of the inner side E of the device housing 19.

As shown in FIG. 15, the fourth hydrochromic material 20 may be coated around the edge of the inner side E of the device housing 19. When the moisture enters any area of the edge of the electronic device, the fourth hydrochromic material 20 changes the color. After the device housing 19 is removed, the area where the moisture enters can be directly and accurately determined, and then performance tests are performed on the component 2 in the area.

Of course, in other embodiments not shown, the fourth hydrochromic material 20 may be coated on the entire surface of the inner side E of the device housing 19, but it is not limited thereto. In practical application, the fourth hydrochromic material 20 may be coated on any area of the inner side E of the device housing 19 by those skilled in the art according to actual needs.

The display device according to the embodiment of the present disclosure has the corresponding beneficial effects of the circuit board according to the embodiment of the present disclosure, and details are not described here. Additionally, the electronic device according to the embodiment of the present disclosure may also include any structure known to those skilled in the art, which is not described in detail or limited in the embodiment of the present disclosure.

It is to be noted that the above are only preferred embodiments of the present disclosure and technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail through the preceding embodiments, the present disclosure is not limited to the preceding embodiments and may include more other equivalent embodiments without departing from the concept of the present disclosure. The scope of the present disclosure is determined by the scope of the appended claims.

What is claimed is:

1. A circuit board, comprising:
   a substrate;
   an insulating ink layer disposed on the substrate;
   a component disposed on a side of the insulating ink layer facing away from the substrate, wherein the component is electrically connected to the substrate through a window opening area on the substrate; and
   an encapsulation layer disposed on a side of the component facing away from the substrate;
   wherein the insulating ink layer comprises a first hydrochromic material, wherein in a case where humidity exceeds a first humidity threshold, the first hydrochromic material changes from a first color to a second color.

2. The circuit board according to claim 1, wherein the first hydrochromic material is capable of resisting a high-temperature environment with a first temperature value, wherein the first temperature value is a welding temperature of the component in a soldering furnace.

3. The circuit board according to claim 1, wherein in a case where the humidity changes, at least part of the first hydrochromic material maintains a color at a highest humidity.

4. The circuit board according to claim 1, wherein in a case where the humidity exceeds the first humidity threshold, the first hydrochromic material changes a color to different degrees in different humidity ranges.

5. The circuit board according to claim 1, wherein the first hydrochromic material is distributed in the insulating ink layer.

6. The circuit board according to claim 1, wherein the insulating ink layer comprises an insulating coating and a first hydrochromic layer, wherein the first hydrochromic layer is located on a side of the insulating coating facing away from the substrate, and the first hydrochromic layer comprises the first hydrochromic material.

7. The circuit board according to claim 1, wherein the first hydrochromic material is disposed in at least part of an edge area of the substrate.

8. The circuit board according to claim 7, wherein the first hydrochromic material is disposed around the window opening area.

9. The circuit board according to claim 1, wherein the first hydrochromic material is disposed around an edge area of the substrate.

10. The circuit board according to claim 1, further comprising a second hydrochromic layer disposed on the side of the component facing away from the substrate, wherein the second hydrochromic layer comprises a second hydrochromic material, and in a case where humidity exceeds a second humidity threshold, the second hydrochromic material changes from a third color to a fourth color.

11. The circuit board according to claim 10, wherein the second hydrochromic layer is disposed between the component and the encapsulation layer.

12. The circuit board according to claim 10, wherein the second hydrochromic layer is disposed on a side of the encapsulation layer facing away from the substrate.

13. The circuit board according to claim 1, wherein a third hydrochromic material is distributed in the encapsulation layer, wherein in a case where humidity exceeds a third humidity threshold, the third hydrochromic material changes from a fifth color to a sixth color.

14. The circuit board according to claim 13, where a plurality of sealed communication structures are formed in the encapsulation layer, wherein the third hydrochromic material is disposed within at least one of the sealed communication structures.

15. An electronic device, comprising a circuit board, wherein the circuit board comprises:
a substrate;
an insulating ink layer disposed on the substrate;
a component disposed on a side of the insulating ink layer facing away from the substrate, wherein a component of the component is electrically connected to the substrate through a window opening area on the substrate; and
an encapsulation layer disposed on a side of the component facing away from the substrate;
wherein the insulating ink layer comprises a first hydrochromic material, wherein in a case where humidity exceeds a first humidity threshold, the first hydrochromic material changes from a first color to a second color; and
wherein
the electronic device further comprises a display panel and a device housing, wherein a side of the device housing attached to the display panel is an inner side of the device housing, the inner side of the device housing is provided with a fourth hydrochromic material, and in a case where humidity exceeds a fourth humidity threshold, the fourth hydrochromic material changes from a seventh color to an eighth color.

16. The electronic device according to claim 15, wherein at least part of an edge area of the inner side of the device housing comprises the fourth hydrochromic material.

17. The electronic device according to claim 15, wherein the fourth hydrochromic material is disposed around an edge area of the inner side of the device housing.

18. The electronic device according to claim 15, wherein the first hydrochromic material is capable of resisting a high-temperature environment with a first temperature value, wherein the first temperature value is a welding temperature of the component in a soldering furnace.

19. The electronic device according to claim 15, wherein in a case where the humidity changes, at least part of the first hydrochromic material maintains a color at a highest humidity.

20. The electronic device according to claim 15, wherein in a case where the humidity exceeds the first humidity threshold, the first hydrochromic material changes a color to different degrees in different humidity ranges.

* * * * *